(12) United States Patent
Huizing et al.

(10) Patent No.: US 6,759,696 B2
(45) Date of Patent: Jul. 6, 2004

(54) BIPOLAR TRANSISTOR, SEMICONDUCTOR DEVICE AND METHOD OF MANUFACTURING SAME

(75) Inventors: Hendrik Gezienus Albert Huizing, Eindhoven (NL); Jan Willem Slotboom, Eindhoven (NL); Doede Terpstra, Eindhoven (NL); Johan Hendrik Klootwijk, Eindhoven (NL); Eyup Aksen, Louvain (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 52 days.

(21) Appl. No.: 10/210,499

(22) Filed: Aug. 1, 2002

(65) Prior Publication Data

US 2003/0054599 A1 Mar. 20, 2003

(30) Foreign Application Priority Data

Aug. 6, 2001 (EP) .............................................. 01203002

(51) Int. Cl.$^7$ ............................................. H01L 31/072
(52) U.S. Cl. ...................................... 257/195; 438/202
(58) Field of Search ................................. 438/202, 602, 438/604, 606; 257/22–23, 13, 19, 75, 85, 87–88, 103, 197–198, 195, 511, 515, 518, 592, 525–526, 656

(56) References Cited

U.S. PATENT DOCUMENTS

| | | | | |
|---|---|---|---|---|
| 4,996,581 A | | 2/1991 | Hamasaki | 357/34 |
| 5,041,892 A | * | 8/1991 | Yano et al. | 257/558 |
| 5,175,603 A | | 12/1992 | Hamasaki | 257/592 |
| 5,589,409 A | * | 12/1996 | Bulucea et al. | 438/377 |
| 6,525,348 B1 | * | 2/2003 | Scott et al. | 257/187 |

\* cited by examiner

Primary Examiner—David Nelms
Assistant Examiner—David Vu
(74) Attorney, Agent, or Firm—Aaron Waxler

(57) ABSTRACT

The bipolar transistor comprises a collector region (1) of a semiconductor material having a first doping type, a base region (2) of a semiconductor material having a second doping type, and an emitter region (3) having the first doping type. A junction is present between the emitter region (3) and the base region (2), and, viewed from the junction (4), a depletion region (5) extends into the emitter region (3). The emitter region (3) comprises a layer (6) of a first semiconductor material and a layer (7) of a second semiconductor material.

The first semiconductor material has a higher intrinsic carrier concentration than the second semiconductor material. The layer (7) of said second semiconductor material is positioned outside the depletion region (5). The second semiconductor material has such a doping concentration that Auger recombination occurs.

The invention also relates to a semiconductor device comprising such a bipolar transistor.

The method of manufacturing the bipolar transistor comprises the step of forming an emitter region (3) with a first doping type on a collector region (1) of a semiconductor material with a first doping type, and a base region (2) of a semiconductor material having a second doping type. The emitter region (3) is formed by epitaxially depositing a first layer (6) of a first semiconductor material and subsequently epitaxially depositing a second layer (7) of a second semiconductor material. The second layer (7) is doped with the first doping type, such that Auger recombination occurs. The intrinsic carrier concentration of the second semiconductor material is higher than the intrinsic carrier concentration of the first semiconductor material.

The Auger recombination dominates the base current and allows accurate tuning of the base current and the current gain of the bipolar transistor.

8 Claims, 6 Drawing Sheets

BIPOLAR TRANSISTOR, SEMICONDUCTOR DEVICE AND METHOD OF MANUFACTURING SAME

FIELD OF THE INVENTION

The invention relates to a bipolar transistor comprising
a collector region with a first doping type,
a base region with a second doping type,
and an emitter region with the first doping type,
a junction being situated between the emitter region and the base region, and, viewed from said junction, a depletion region extending in the emitter region,
and, said emitter region comprising a layer of a first semiconductor material and a layer of a second semiconductor material.

The invention also relates to a method of manufacturing a bipolar transistor comprising a collector region with a first doping type and a base region with a second doping type, on which an emitter region with the first doping type is formed, said emitter region including a layer of a first semiconductor material and a layer of a second semiconductor material.

BACKGROUND AND SUMMARY OF THE INVENTION

U.S. Pat. No. 5,535,912 discloses a bipolar transistor that can suitably operate at high frequencies. Said bipolar transistor has a cutoff frequency of typically 100 GHz, as a result of which the transistor can suitably be used as a component in optical communications networks for transporting 40 Gb/s.

The bipolar transistor is made from silicon and includes a base region with a $Ge_xSi_{1-x}$ strained layer. As the bandgap of $Ge_xSi_{1-x}$ is smaller than that of Si, with the conduction band coinciding with that of silicon, and the valence band energetically moved by ΔEv with respect to the valence band of Si, the charge storage in the base region and the emitter region is reduced relative to silicon bipolar transistors at comparable current levels. In order to maximize the speed of the transistor, the percentage of Ge in the base region is as high as possible.

In the known bipolar transistor, the charge storage in the emitter is also reduced, which can be attributed to the fact that the bandgap, viewed from the junction, decreases linearly in the direction of the emitter contact. During operation of the bipolar transistor, minority charge carriers are injected into the emitter region from the base region and accelerated by the internal electric field in the emitter, as a result of which the average residence time decreases.

The $Ge_xSi_{1-x}$ strained layer in the base region causes a change of the bandgap ΔEv, as a result of which the collector current increases exponentially by ΔEv. As a result, the current gain, which is defined as the quotient of the collector current and the base current, increases substantially. A drawback of a base region with $Ge_xSi_{1-x}$ resides in that the current gain is too high, as a result of which collector-emitter breakdown occurs rapidly. The device is not robust because the bipolar transistor amplifies the current internally. For practical applications, a current gain of only approximately 100 is desired.

In the known heterojunction bipolar transistor, the collector current is reduced by increasing the base doping. In addition, the emitter contact is made of a metal instead of the customarily used polysilicon. The recombination of minority charge carriers at a metal contact exceeds that at a polysilicon contact by approximately one order or magnitude, as a result of which the base current is increased by approximately one order of magnitude.

A drawback of the known bipolar transistor resides in that setting the value of the base current is difficult. As the metal contact borders on the emitter region, and reacts at the interface with the second semiconductor material of the emitter region, the width of the emitter region, viewed from the junction, is highly subject to variations.

As the width of the emitter region of a bipolar transistor intended for high-speed applications is very small, the decrease of the emitter width due to the interface reaction, causing a part of the emitter region to be consumed, is comparatively large. The base current depends very substantially on the width of the emitter region and the interface between the emitter region and the metal. A metal contact leads to a substantial variation in base current between bipolar transistors and hence to a substantial variation in current gain.

It is an object of the invention to provide a bipolar transistor of the type described in the opening paragraph, which enables the current amplification to be very accurately adjustable via the base current.

As regards the bipolar transistor in accordance with the invention, this object is achieved in that the intrinsic carrier concentration of the second semiconductor material exceeds the intrinsic carrier concentration of the first semiconductor material, the layer of the second semiconductor material is situated outside the depletion region, and the second semiconductor material is doped such that Auger recombination occurs.

When the bipolar transistor is in operation, minority charge carriers injected from the base region into the emitter region diffuse from the depletion region in the direction of an emitter contact that borders on the emitter region. In the layer of the second semiconductor material, the intrinsic concentration n, of minority charge carriers is greater than the intrinsic concentration in the first semiconductor material due to a smaller bandgap of the second semiconductor material. In a semiconductor, $n_i^2=np$, where n is the concentration of electrons and p is the concentration of holes, so that an increased concentration of minority charge carriers is present in the layer of the second semiconductor material. The physical effect causing an increase in base current is referred to as Auger recombination.

Auger recombination occurs if excess charge carriers recombine in semiconductor material having a high doping concentration. The probability of direct recombination between holes and electrons must not be negligible relative to the recombination speed due to traps (Schottky Read Hall recombination). In the case of Auger recombination, there are three charge carriers that interact with each other, i.e. either two electrons and one hole, or two holes and one electron. Two charge carriers recombine and the third charge carrier takes over the impulse from the incident charge carriers and the energy released by said recombination.

For an n-type emitter, the Auger recombination depends quadratically on the electron concentration and linearly on the hole concentration. Auger recombination contributes dominantly to the base current if the hole concentration is increased by a number of orders of magnitude by the use of the second semiconductor material having a smaller bandgap and hence a higher intrinsic concentration. The increase of the minority charge carriers depends exponentially on the decrease in bandgap. Thus, by accurately setting the bandgap as a function of the composition of the second semiconductor material, the base current can be very accurately set, so that also the current amplification can be very accurately set.

The first semiconductor material in the emitter region may be, for example, InAlAs, and the second semiconductor material may be, for example, InGaAs. An N-type doping for these materials is, for example, silicon, and a p-type doping is, for example, beryllium. Alternatively, silicon may be used for the bipolar transistor comprising Si as the first semiconductor material and a $Ge_xSi_{1-x}$ composition as the second semiconductor material. For the N-type doping use can be made, for example, of As or P, and for the p-type doping use can be made, for example, of B.

Owing to the comparatively high intrinsic concentration, Ge can particularly suitably be used as the second semiconductor material.

Advantageously, the second semiconductor material has a composition that is at least substantially constant over at least a part of the layer. As a result, the bandgap is at least substantially constant over said part as well as the intrinsic carrier concentration. In comparison with a situation where the composition of the second semiconductor material varies, a better setting of the Auger recombination can be achieved in the part of the layer having the at least substantially constant composition, so that the base current that is dominated by Auger recombination can be more accurately set.

Preferably, the first semiconductor material of the emitter region is silicon, and the second semiconductor material is a composition of Si and Ge.

A great advantage of $Ge_xSi_{1-x}$ resides in that, in terms of energy, the conduction band is at the same level as the conduction band of silicon. By virtue thereof, it is possible not to influence the collector current while the base current can be accurately adjusted by means of the percentage of Ge in the second semiconductor layer. As a result of the smaller bandgap of the part of the layer with the $Ge_xSi_{1-x}$ composition, the hole concentration increases in the semiconductor layer. Said increase of the hole concentration depends exponentially on the decrease of the bandgap. The bandgap of $Ge_xSi_{1-x}$ depends substantially linearly on the percentage of Ge. Auger recombination contributes dominantly to the base current if the hole concentration is increased by a number of orders of magnitude by using $Ge_xSi_{1-x}$.

An additional advantage is that the collector current and the speed of the device, characterized by, inter alia, the cutoff frequency $f_T$, remains unchanged. As the current amplification can be reduced, the emitter-collector breakdown voltage BVceo increases and hence the product of $f_T \times BVceo$ increases too.

A further advantage resides in that the current amplification is less sensitive to temperature effects. Bipolar transistors carrying much current, such as power transistors, are internally heated by the current, as a result of which the current amplification increases. As a result of the smaller bandgap of $Ge_xSi_{1-x}$ in the emitter region, the $Ge_xSi_{1-x}$ in the emitter region has a negative temperature effect on the current amplification. This negative temperature effect at least partly compensates for the positive temperature effect, as a result of which the current amplification remains more constant as a function of temperature.

For a high-speed bipolar transistor it is very important that the lifetime of the minority charge carriers is short. The lifetime τ of the minority charge carriers is approximately $\tau = 1/(\Gamma N^2)$, where in the case of silicon $\Gamma = 2 \times 10^{-31}$ cm$^6$s$^{-1}$, and N is the doping in the part of the layer of the emitter region. Thus, at a doping concentration of $3 \times 10^{20}$ cm$^{-3}$, the lifetime is typically 0.05 ns. Therefore, to obtain a short lifetime, the doping concentration advantageously is as high as possible, preferably above $3 \times 10^{-20}$ cm$^{-3}$, in the part of the layer including the second semiconductor material.

It is advantageous that the part of the layer comprising the second semiconductor material is n-type doped. In general, npn transistors are faster than pnp transistors. The mobility for electrons is a few times higher than the mobility for holes, so that charge transport of electrons is faster. In addition, the solubility of an n-type doping, particularly As, is much higher than that of a p-type doping, such as B, so that comparatively many charge carriers are electrically active.

In addition, n-type doping enables much shallower emitters to be manufactured, so that charge storage in the emitter is comparatively small. In the manufacture of the transistor, the diffusion of n-type doping atoms, such as As and Sb, takes place at a much lower rate than the diffusion of p-type doping atoms, such as B, so that much steeper doping profiles are manufactured and the emitters become shallower.

The maximum percentage of germanium in the composition of the second semiconductor material is connected with the thickness of the layer. As the lattice constant of germanium (5.66 Å) exceeds that of silicon (5.43 Å), compressive stress occurs in the $Ge_xSi_{1-x}$ layer when this layer is epitaxially provided on a silicon lattice. If the stress in the $Ge_xSi_{1-x}$ layer becomes too large, relaxation of the layer takes place. If the percentage of $Ge_xSi_{1-x}$ practically exceeds 30%, the $Ge_xSi_{1-x}$ layer causes the stress to relax, so that the layer is no longer properly epitaxial and lattice errors and defects occur. Thus, in practice, the percentage of Ge remains comparatively low.

It is important that the minority charge carriers cannot tunnel through the part of the layer, but instead Auger recombine in the second semiconductor material. For this reason, the part of the layer has a width of at least several atomic layers, which, dependent upon the material, typically exceeds several nanometers. For a high Ge concentration of 30%, it is desirable, however, due to the stress relaxation, that the layer is not too thick, i.e. the thickness should typically be below 10 nm.

Preferably, the layer with the second semiconductor material at least substantially adjoins the emitter contact. As, in general, the doping is diffused in the emitter region by diffusion, the concentration of doping atoms of the first type is highest at the surface. Here, Auger recombination in the part of the layer of the second semiconductor is very substantial. By virtue of the dominant effect of the Auger recombination, the base current can be perfectly adjusted by varying the Ge concentration. However, if the doping concentration in the emitter region is at least substantially constant, it is advantageous if the layer with the second semiconductor material at least substantially adjoins the depletion region, because, at said location, the concentration of minority charge carriers is highest.

The bipolar transistor may be part of a semiconductor device comprising a semiconductor body of a first semiconductor material. The invention also relates to such a device.

The semiconductor device may be, for example, an integrated circuit of the bipolar transistor and a CMOS circuit (BiCMOS) or a memory. The semiconductor body of the first semiconductor material may be, for example, silicon, and the bipolar transistor may be a $Ge_xSi_{1-x}$ HBT.

Alternatively, the semiconductor body may be InP and the bipolar transistor may be an InAlAs/InGaAs HBT.

Another object of the invention is to provide a method of manufacturing the bipolar transistor of the type described in the opening paragraph, by means of which the value of the base current is accurately defined.

As regards the method, the object of the invention is achieved, in accordance with the invention, in that a first layer of the first semiconductor material is epitaxially provided on the base region, after which a second layer of the second semiconductor material is subsequently epitaxially provided and doped with a first doping type in such a manner that Auger recombination occurs, and the intrinsic carrier concentration of the second semiconductor material exceeds that of the first semiconductor material.

The first semiconductor material with the comparatively larger bandgap and the smaller intrinsic carrier concentration may be, for example, InAlAs, and the second semiconductor material may be InGaAs. The layers are epitaxially grown on the base region, for example, by means of gas source molecular beam epitaxy. For the emitter use can be made, for example, of a heavily doped n-type emitter, the doping being provided, for example, by means of ion implantation and diffusion. The doping concentration at which Auger recombination occurs depends on the semiconductor material. The doping concentration is comparatively high, which generally leads to bandgap narrowing. The second semiconductor material may be, for example, a III–V semiconductor, germanium, or a compound of germanium, such as SiGe.

Advantageously, the composition of the second semiconductor material over the second layer is at least substantially constant. A constant composition of the material has the advantage that the bandgap is at least substantially constant and hence the intrinsic concentration of charge carriers is also at least substantially constant. This enables the magnitude of the Auger recombination to be accurately adjusted.

An advantageous combination of semiconductor materials in the emitter region comprises Si as the first semiconductor material and a composition of Si and Ge as the second semiconductor material. A great advantage resides in that the epitaxy cannot only be carried out using a slow growth method, such as MBE, but also by means of a fast deposition method, such as chemical vapor deposition. During the deposition process, the doping can be provided in situ. In this manner a substantially constant doping level in the second semiconductor material is guaranteed. As the whole emitter region has the same doping type, for example the n-type, it is advantageous to n-type dope the first semiconductor material, so that in the growth process of the second semiconductor material with the same n-type doping, it is not necessary to switch on the gases, as a result of which the doping is more uniform and autodoping does not occur.

The doping level that can be provided in situ in the semiconductor materials depends on the temperature of the deposition and on the doping atom. The solubility of As is related to the temperature at which deposition takes place. P has a lower solubility product and hence is less suitable for high doping levels in the emitter region. Sb has a comparatively low solubility product, however, in the case of clustering, a doping concentration of $1 \times 10^{20}$ cm$^{-3}$ can be attained. An advantage of Sb resides in that the diffusion coefficient is comparatively low, so that steep profiles can be obtained.

Alternatively, the high doping level in the emitter region can be provided in that an emitter contact is formed on the emitter region by providing a polysilicon layer having a doping of the first doping type on the emitter region, and the second layer is doped through outdiffusion of the doping atoms of the polysilicon layer. The doping may have been provided in the polysilicon during the deposition process, however, in general the doping is provided in the polysilicon layer through ion implantation. Subsequently, during a step at a high temperature of approximately 900° C., the doping atoms are diffused from the polysilicon layer into the emitter region. It is important to make sure that the diffusion time at high temperatures is short so as to obtain a shallow emitter region. To achieve this, use is often made of rapid thermal annealing RTA, or laser annealing. The doping is brought to high temperatures for a few seconds only, as a result of which outdiffusion is small.

In an advantageous method of manufacturing a semiconductor device comprising a semiconductor body of the first semiconductor material, the collector and the base region are generally provided on a substrate. In the case of InAlAs/InGaAs transistors, the semiconductor material is InP.

The bipolar transistor of InAlAs/GaAs may be integrated with InP devices so as to form an optoelectronic circuit that can very suitably be used as a component in an optoelectronic network. A semiconductor device comprising a semiconductor body of Si and a bipolar transistor of silicon can particularly suitably be used for BiCMOS and embedded memories.

The bipolar transistor is manufactured in a CMOS process requiring only a few additional masking steps.

The emitter region can be selectively epitaxially grown in an emitter window of, for example, oxide and/or nitride, as described in WO 9737377.

Growing the emitter in an emitter window by means of selective epitaxy is advantageous because it does not require additional masking steps. As selective growth is difficult, the emitter region may alternatively be formed with a differential epitaxial layer, as described in U.S. Pat. No. 5,821,149.

In general, it is advantageous to form the emitter at a late stage in the process, so that the thermal budget of the emitter is small, as a result of which the emitter remains shallow and the doping atoms are not electrically deactivated.

To form the emitter region in the semiconductor device, the methods described hereinabove apply, and all combinations also apply to the semiconductor device.

These and other aspects of the invention will be apparent from and elucidated with reference to the embodiment(s) described hereinafter.

DETAILED DESCRIPTION OF THE INVENTION

Figure 1:
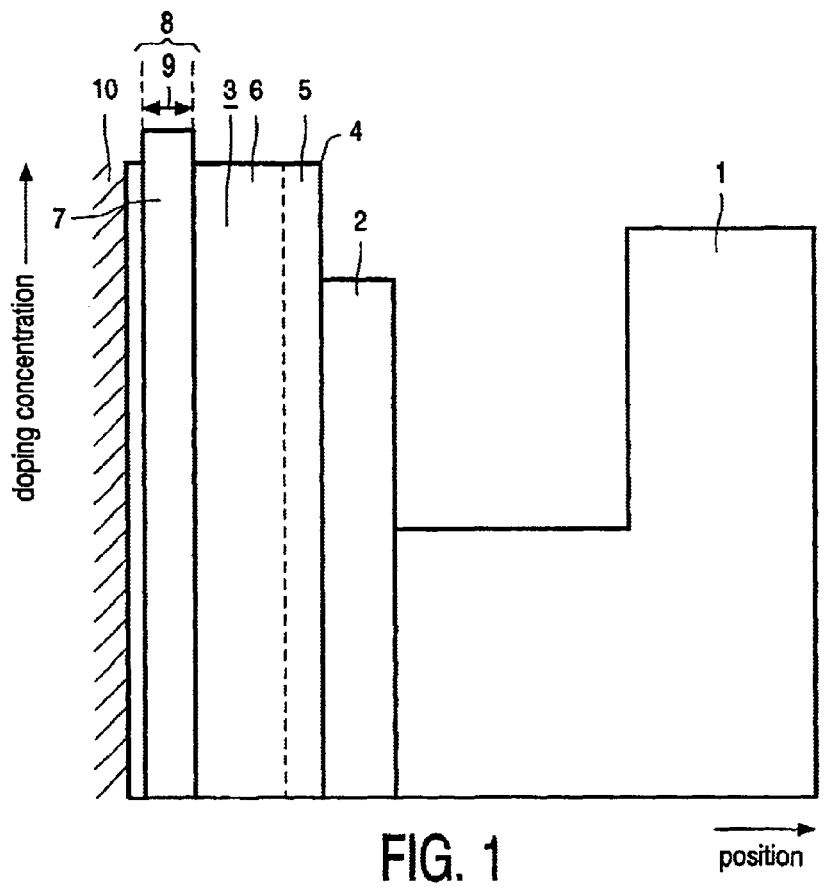
FIG. 1 diagrammatically shows the bipolar transistor in accordance with the invention.

The bipolar transistor shown in FIG. 1 comprises a collector region 1 with a first doping type, a base region 2 with a second doping type, and au emitter region 3 with a first doping type. A junction 4 is present between the emitter region 3 and the base region 2, and, viewed from said junction, a depletion region 5 extends in the emitter region 3. The emitter region 3 comprises a layer 6 of a first semiconductor material and a layer 7 of a second semiconductor material.

The intrinsic carrier concentration of the second semiconductor material 7 is higher than that of the first semiconductor material 6. The second semiconductor material 7 is situated outside the depletion region 5. The layer 7 comprising the second semiconductor material is comparatively heavily doped. Said doping is such that Auger recombination occurs. In the embodiment shown, the part 8 of layer 7, where the composition of the second semiconductor material is at least substantially constant, is the whole layer 7.

Figure 2:
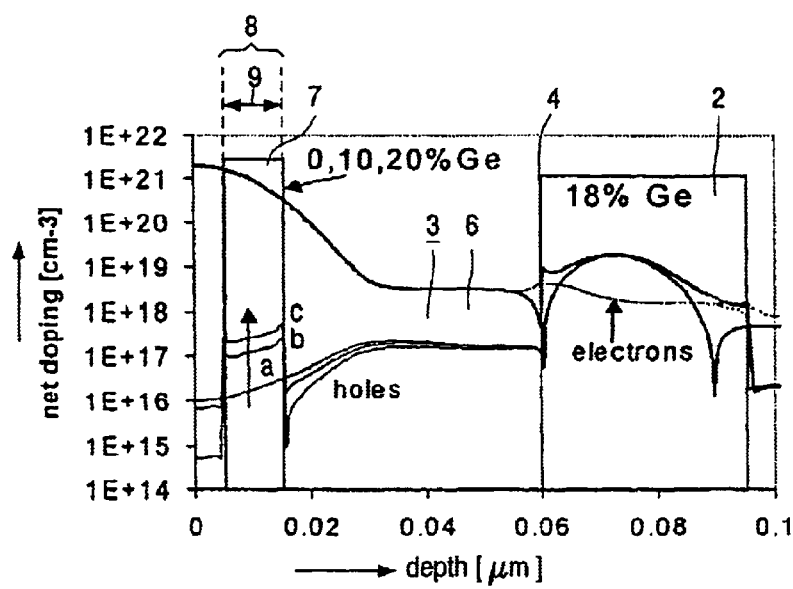
FIG. 2 shows a first embodiment of the bipolar transistor in accordance with the invention, wherein a part of the layer of $Ge_xSi_{1-x}$ is situated in the emitter region, and the percentage of Ge has been varied.

In an advantageous embodiment of the bipolar transistor shown in FIG. 2, the layer 6 of the first semiconductor material is made of silicon and the layer 7 of the second semiconductor material is made of a composition including silicon and germanium.

The layer 7 of SiGe is n-type doped with As, the profile being steep at a doping concentration above $3 \times 10^{20}$ cm$^{-3}$. Said SiGe in the emitter region causes the equilibrium concentration of the holes to be locally increased. Auger recombination scales quadratically with the n-type concentration and linearly with the hole concentration. Auger recombination is used to increase the base current. The concentration of holes increases by several orders of magnitude if the Ge percentage is increased by, respectively, 10% and 20%. In the layer 7, the reference level of the hole concentration without Ge is indicated by means of curve a. The hole concentration at 10% Ge is indicated by means of curve b, and the hole concentration at 20% Ge is indicated by means of curve c. At 20% Ge, the hole concentration in the layer 7 increases by more than one order of magnitude.

In this embodiment, the layer 7 has a thickness 9 of 10 nm. This thickness 9 of the layer is sufficient to cause Auger recombination of substantially all holes. In this embodiment, the layer 7 is situated 5 nm below the emitter contact 10. At the emitter contact 10, there is equilibrium concentration for holes. As both the Auger recombination and the surface recombination at the emitter contact are linear with the hole concentration, it is obvious that the Auger recombination makes a dominant contribution to the base current. After all, in the case of 20% Ge (curve c), the equilibrium concentration of holes at the emitter contact 10 is more than one order of magnitude smaller than in reference curve a.

The layer 7 of the second semiconductor material 7 may border on the emitter contact. As the interface between, for example, a polysilicon emitter contact and the monosilicon emitter region is generally not perfect, the part of the layer is situated just below the surface of the emitter region and the emitter contact.

Figure 3:
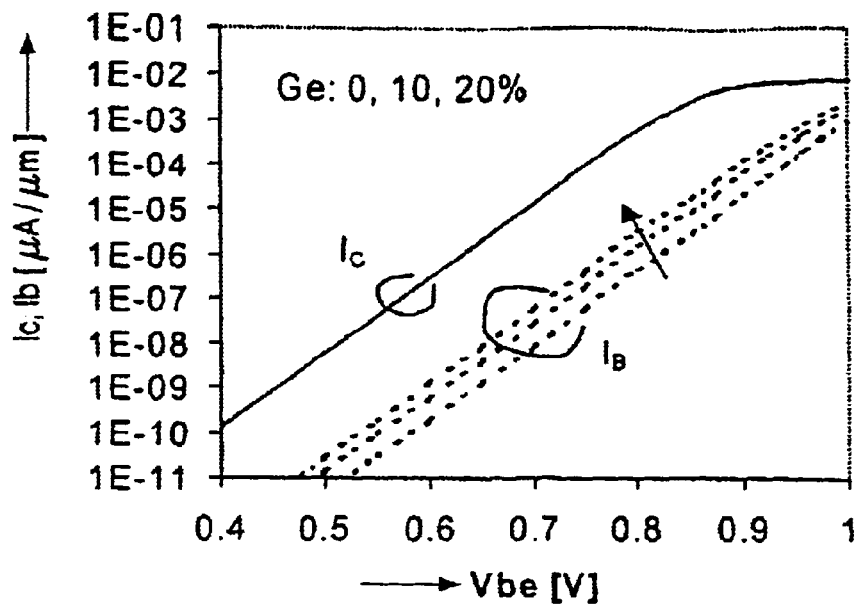
FIG. 3 shows a Gummel plot of a bipolar transistor in accordance with the first embodiment.

The effect of the increase of the Ge percentage on the base current is visible in FIG. 3. At a collector-base voltage $V_{CB}$ of 1 V, the base current increases by approximately a factor of 10 if the percentage is increased from 0 to 20 percent. The initially excessively high current gain of 1300 is reduced to 130. The value of the collector current remains unchanged as the percentage of Ge increases. Also the cutoff frequency remains constant at 90 GHz.

The bipolar transistor may be part of a semiconductor device comprising a semiconductor body of a first semiconductor material. The semiconductor material of the bipolar transistor may be crystalline silicon, III–V semiconductors, Si—Ge, Si—C layers, or other compounds.

Figure 4:
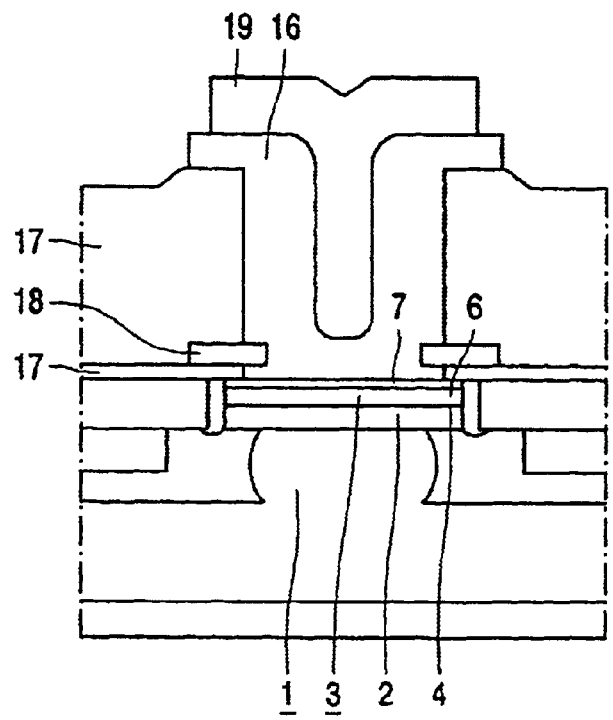
FIG. 4 is a diagrammatic, cross-sectional view of the bipolar transistor manufactured in accordance with the method.

In FIG. 4, parts corresponding to parts of FIG. 1 are indicated by means of the same reference numeral. In the method in accordance with the invention, an emitter region 3 with a first doping type is formed on a collector region 1 with a first doping type and a base region 2 with a second doping type. The emitter region 3 is formed by epitaxially providing a first layer 6 of the first semiconductor material, after which a second layer 7 of the second semiconductor material is subsequently epitaxially provided and doped with the first doping type in such a manner that Auger recombination occurs. The intrinsic carrier concentration of the second semiconductor material exceeds that of the first semiconductor material.

In an advantageous method in accordance with the invention, a 0.4 $\mu$m epi layer with a P-doping of $5 \times 10^{17}$ cm$^{-3}$ is present on a heavily doped n-type substrate. There is started from a base region 2 of, for example, a differentially, epitaxially grown layer packet of 20 nm intrinsic Ge$_x$Si$_{1-x}$ (x=0.18), 5 nm Ge$_x$Si$_{1-x}$ (x=0.18) doped with $6 \times 10^{19}$ cm$^{-3}$ boron and 10 nm intrinsic Ge$_x$Si$_{1-x}$ (x=0.18).

The emitter region is formed on the base region. A 100 nm thick layer of silicon is epitaxially grown on the base region. This first layer 6 is doped with, for example, $3 \times 10^{18}$ cm$^{-3}$ phosphor. After 85 nm, a second layer of 10 nm Ge$_x$Si$_{1-x}$ (x=0.2) is epitaxially grown. The composition of the second semiconductor material on the second layer is at least substantially constant. In this embodiment, this second semiconductor layer 7 of Ge$_x$Si$_{1-x}$ is also doped with phosphor, the doping level being $3 \times 10^{18}$ cm$^{-3}$.

Figure 5:
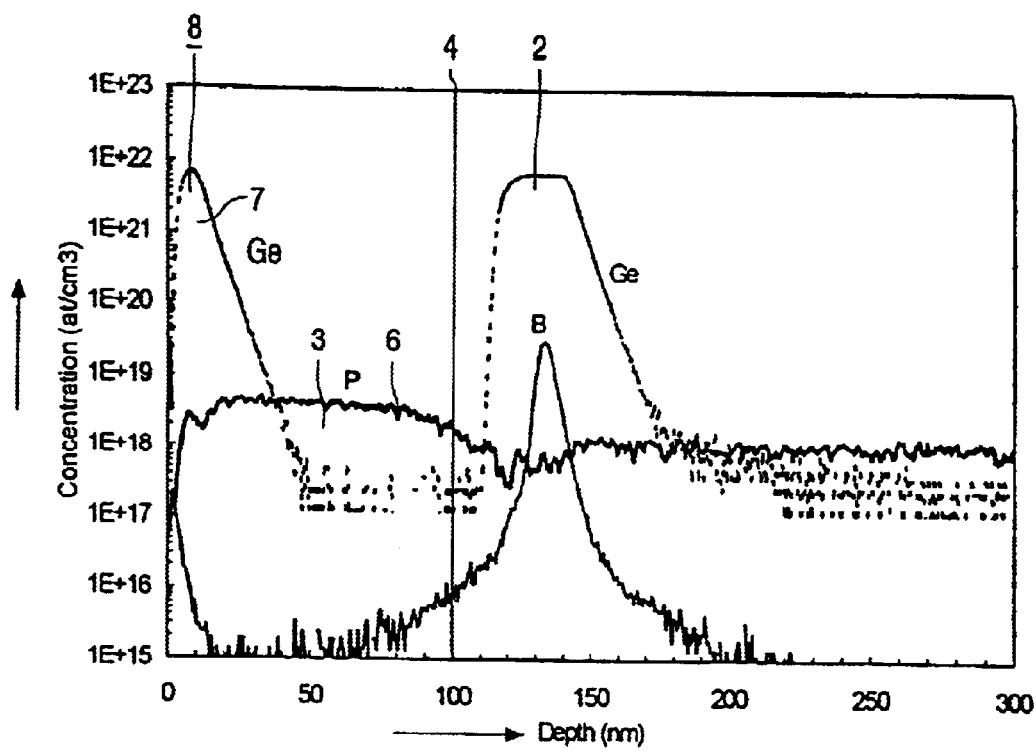
FIG. 5 shows an experimental doping profile of the bipolar transistor in accordance with the first embodiment.

The doping profile of the transistor after the epitaxial growth of the emitter region, shown in FIG. 5, exhibits a high Ge peak just below the emitter surface. The Ge concentration decreases substantially as a function of depth, viewed from the emitter surface. It is practically impossible to grow a box-shaped profile. Only a comparatively small part 8 of the layer 7 has a substantially constant SiGe composition. This does not impose any limitations on the Auger recombination process.

A layer of polysilicon 16 is deposited on the emitter region 3. In the embodiment shown in FIG. 4, the polysilicon is deposited in a window of an isolating material. The isolating material is oxide 17 and nitride 18. The polysilicon layer can be doped by means of ion implantation or it can be doped in situ. In this embodiment, the polysilicon is doped in situ with $3 \times 10^{20}$ cm$^{-3}$ phosphor atoms. The n-type doping atoms are diffused from the polysilicon into the emitter region during 10 seconds at a temperature of 985° C.

Subsequently, the polysilicon emitter contact is patterned by means of lithography and etching, and finally connected to a metal 19.

Figure 6:
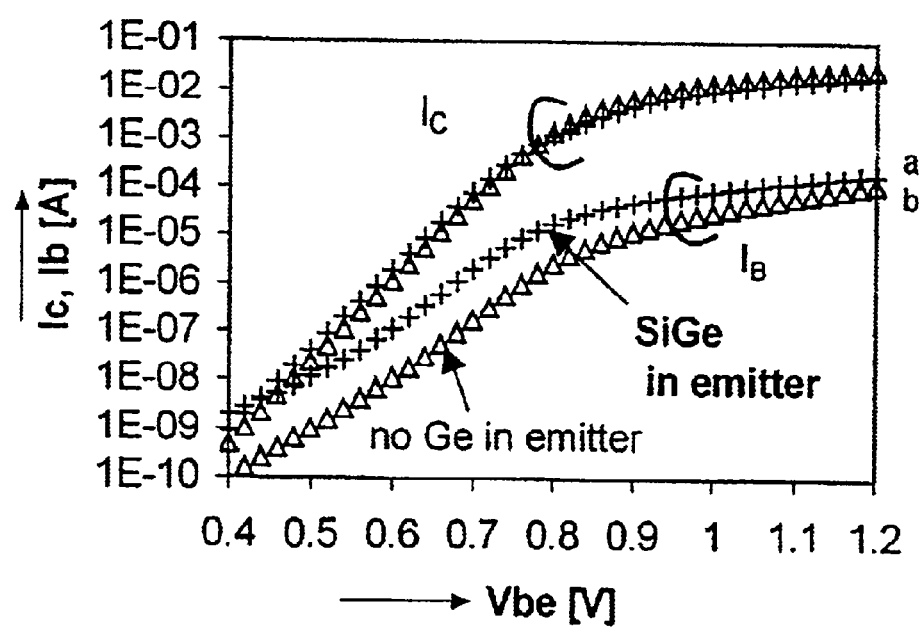
FIG. 6 shows an experimental Gummel plot of a bipolar transistor in accordance with the first embodiment, comprising 20% Ge in the part of the layer of the emitter region, and a reference without Ge.
Figure 7:
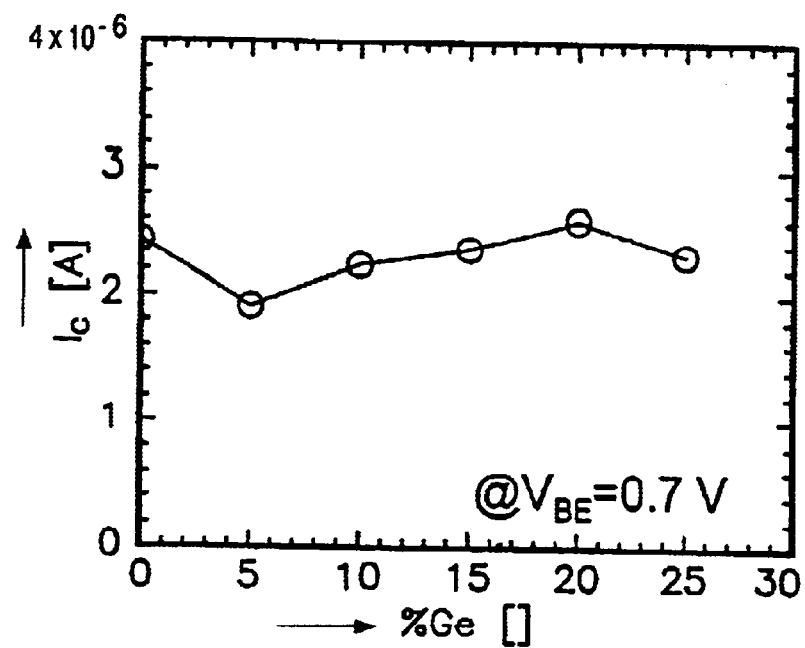
FIG. 7 shows experimental data for the collector and base current as a function of the percentage of Ge in the part of the layer of the emitter region.
Figure 7:
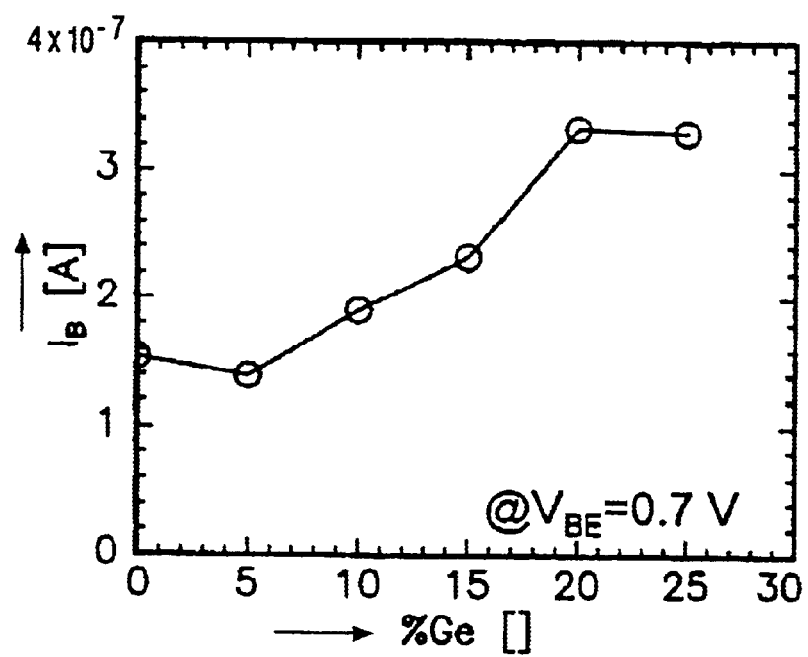

In the Gummel plot shown in FIG. 6, the emitter region 3 has a surface area of 0.3×10 $\mu$m². At a collector-base voltage $V_{CB}$ of 0 V, the base current demonstrates a substantial increase at a Ge percentage of 20% in the emitter region (curve a) with respect to the base current without Ge in the emitter region (curve b). The value of the collector current at 20% Ge in the emitter region is substantially identical to the value of the collector current without Ge in the emitter region. The initial current gain, which is above 1000, is reduced by more than one order of magnitude owing to the increased Auger recombination It is shown in FIG. 7 that, at an emitter-base voltage of 0.7 V, the collector current does not depend on the Ge percentage, whereas the base current increases substantially at an increased Ge percentage in the emitter region.

Figure 8:
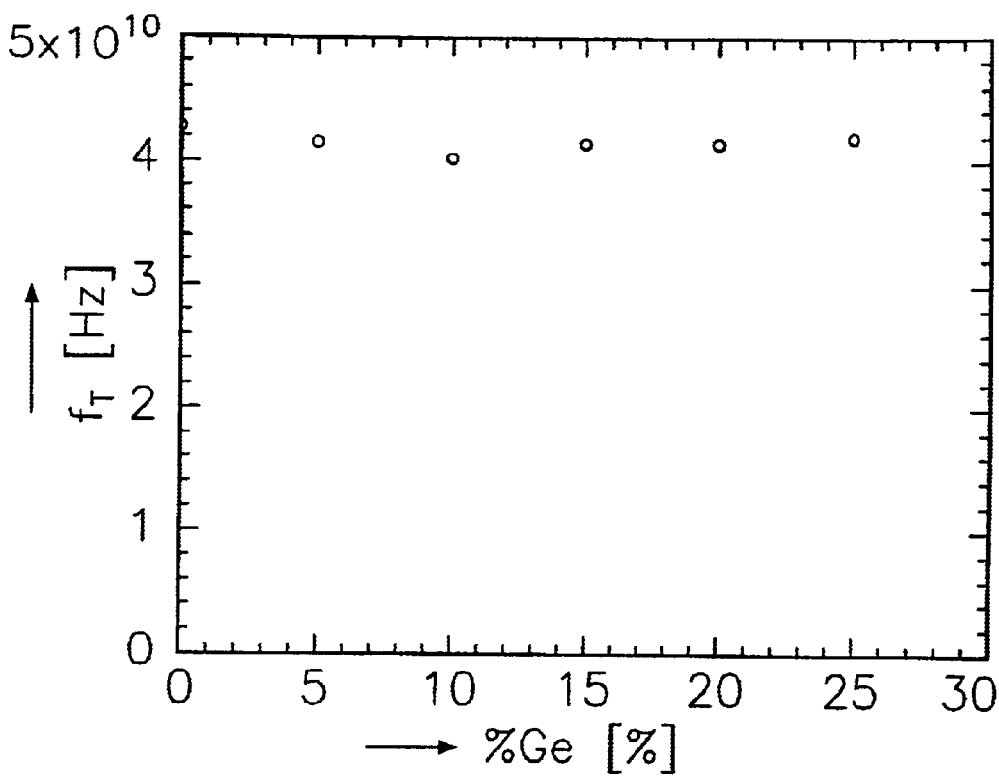
FIG. 8 shows experimental data for the cutoff frequency as a function of the percentage of Ge in the part of the layer of the emitter region.

The high-frequency behavior is not influenced by the Auger recombination. FIG. 8 shows that the cutoff frequency does not depend on the percentage of Ge in the emitter region, and it has a value of typically 40 GHz for this transistor. However, it is very well possible to achieve higher cutoff frequencies. The transistor comprising SiGe in the base region in accordance with the first embodiment has a cutoff frequency of 90 GHz.

Figure 9:
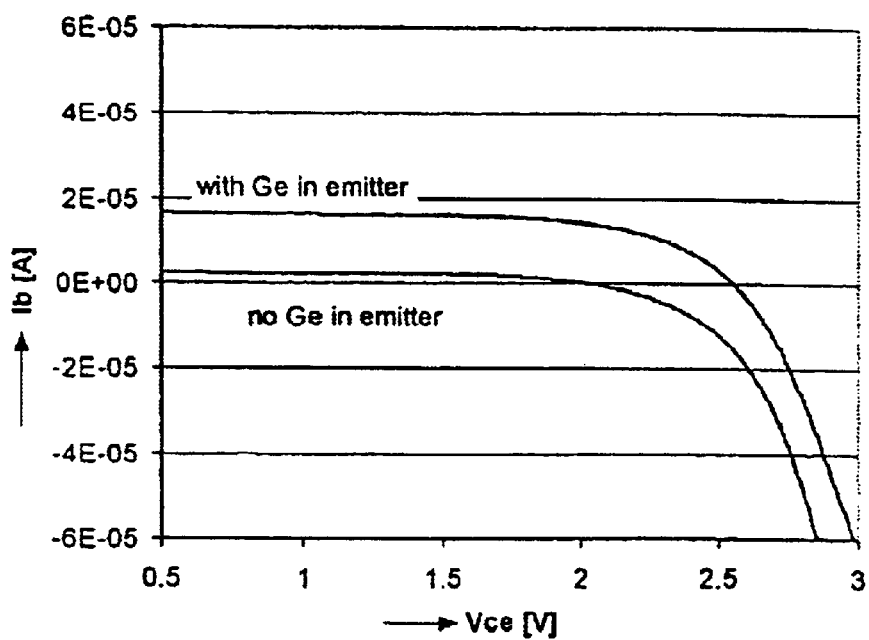
FIG. 9 shows experimental data for the collector-emitter breakdown voltage of the bipolar transistor in accordance with the first embodiment.

FIG. 9 shows that the breakdown voltage of the emitter-collector $BV_{CEO}$ has increased substantially by the addition of 20% Ge in the part of the layer of the emitter region. The $f_T \times BV_{CEO}$ product is indicative of the speed of a bipolar transistor. As the cutoff frequency is not influenced by the addition of Ge in the part of the layer of the emitter region, the $f_T \times BV_{CEO}$ product has increased by 25% and hence also the speed of the transistor at the same $BV_{CEO}$.

Figure 10:
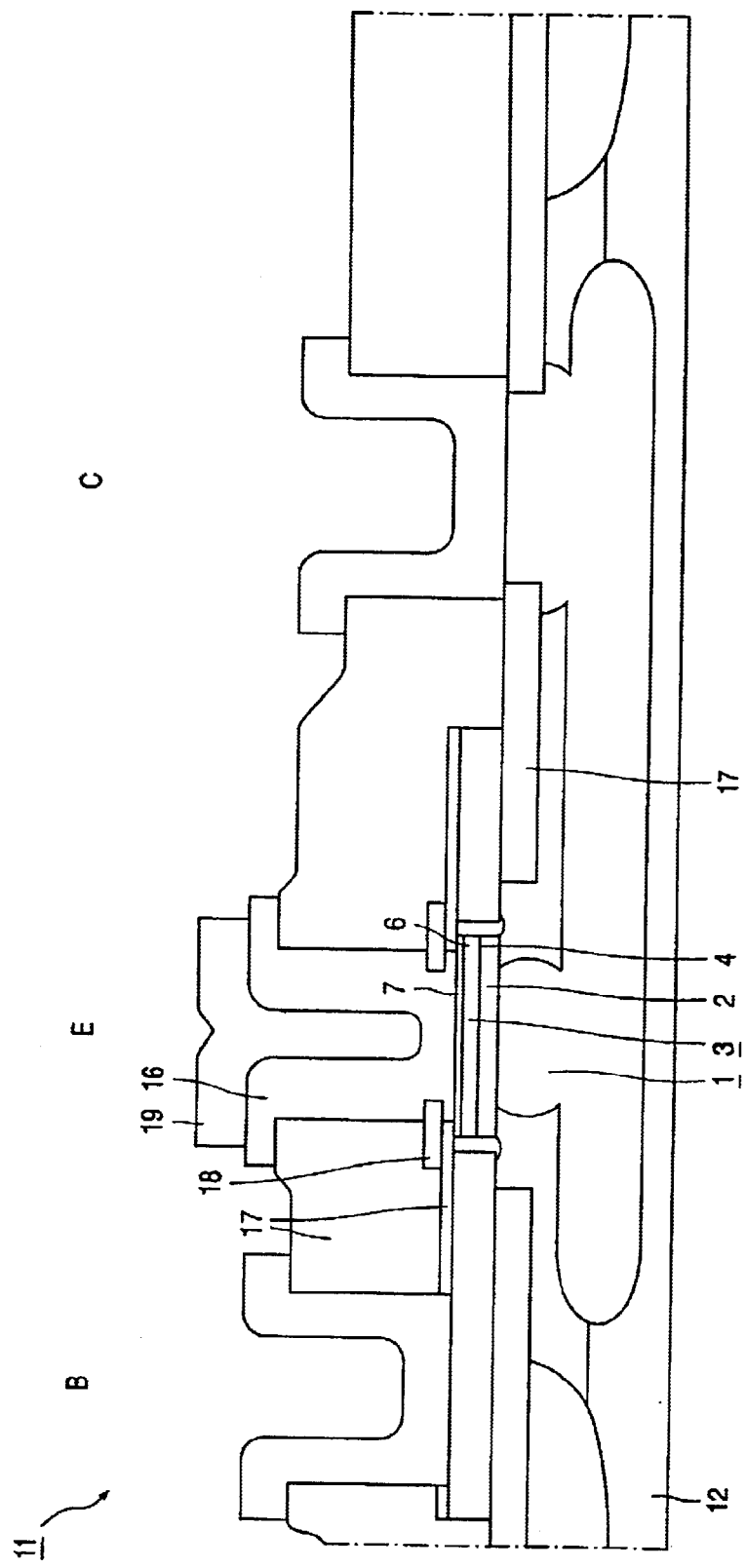
FIG. 10 is a diagrammatic, cross-sectional view of the semiconductor device comprising the bipolar transistor manufactured in accordance with the method.

FIG. 10 shows a semiconductor device 11 comprising a semiconductor body 12 of a first semiconductor material, provided with the bipolar transistor manufactured in accordance with the invention. The bipolar transistor is integrated with CMOS in a so-termed BiCMOS process. The bipolar transistor comprises SiGe as the second layer of semiconductor material in the emitter region 3. As the $Ge_xSi_{1-x}$ strained layer is metastable, it is undesirable to allow the temperature to rise above 900° C. for a prolonged period of time during the manufacturing process. For this reason, generally first the CMOS devices and, for example, embedded non-volatile memories are manufactured, while the emitter region 3 with the second layer 7 of $Ge_xSi_{1-x}$ are formed in a last step.

It is to be noted that the invention is not limited to the examples described hereinabove, and that the invention can be employed in each bipolar transistor or other heterostructure bipolar transistor. In addition, the invention is not limited to n-type transistors, it can also be used for pnp transistors. In addition, the device is not limited to silicon, and it can alternatively be used in germanium, germanium-silicon, III–V and SiC bipolar devices.

The specific dimensions and materials of the specific embodiments can be varied, as will be obvious to those skilled in the art.

What is claimed is:

1. A bipolar transistor comprising a collector region (1) with a first doping type, a base region (2) with a second doping type, and an emitter region (3) with the first doping type, a junction (4) being situated between the emitter region (3) and the base region (2), and, viewed from said junction (4), a depletion region (5) extending in the emitter region (3), and, said emitter region (3) comprising a layer (6) of a first semiconductor material and a layer (7) of a second semiconductor material, characterized in that the intrinsic carrier concentration of the second semiconductor material exceeds the intrinsic carrier concentration of the first semiconductor material, the layer (7) of the second semiconductor material is situated outside the depletion region (5), and the second semiconductor material is doped such that Auger recombination occurs.

2. A bipolar transistor as claimed in claim 1, characterized in that the second semiconductor material has a composition that is at least substantially constant over at least a part (8) of the layer (7).

3. A bipolar transistor as claimed in claim 1, characterized in that the first semiconductor material comprises at least predominantly silicon, and the second semiconductor material comprises a composition of silicon and germanium.

4. A bipolar transistor as claimed in claim 3, characterized in that the percentage of germanium in the composition is below 30%.

5. A bipolar transistor as claimed in claim 1, characterized in that the layer (7) has a doping with a doping concentration of at least 3×10 cm⁻³.

6. A bipolar transistor as claimed in claim 1, characterized in that the layer (7) has a thickness (9) which, viewed perpendicularly from the junction, is above 3 nm.

7. A bipolar transistor as claimed in claim 1, characterized in that the emitter region (3) has an emitter contact (10), and the layer (7) with the second semiconductor material is at least substantially adjacent to the emitter contact (10).

8. A semiconductor device (11) comprising a semiconductor body (12) of the first semiconductor material, and provided with a bipolar transistor as claimed in claim 1.

\* \* \* \* \*